US007498901B2

(12) United States Patent
Naniwada et al.

(10) Patent No.: US 7,498,901 B2
(45) Date of Patent: Mar. 3, 2009

(54) FILTER DEVICE AND TRANSMITTER-RECEIVER UTILIZING BEAM-STRUCTURED MICRO-RESONATORS

(75) Inventors: Koji Naniwada, Tokyo (JP); Shun Mitarai, Kanagawa (JP); Masahiro Tanaka, Kanagawa (JP); Masahiro Tada, Kanagawa (JP)

(73) Assignee: Sony Corporation, Tokyo (JP)

( * ) Notice: Subject to any disclaimer, the term of this patent is extended or adjusted under 35 U.S.C. 154(b) by 183 days.

(21) Appl. No.: 11/568,324

(22) PCT Filed: Mar. 25, 2005

(86) PCT No.: PCT/JP2005/006438

§ 371 (c)(1), (2), (4) Date: Oct. 26, 2006

(87) PCT Pub. No.: WO2005/107067

PCT Pub. Date: Nov. 10, 2005

(65) Prior Publication Data

US 2007/0171001 A1 Jul. 26, 2007

(30) Foreign Application Priority Data

Apr. 28, 2004 (JP) ............................ 2004-133035

(51) Int. Cl.
*H03H 9/70* (2006.01)
*H03H 9/46* (2006.01)

(52) U.S. Cl. ...................................... 333/133; 333/186

(58) Field of Classification Search ................. 333/186, 333/133, 187, 189
See application file for complete search history.

(56) References Cited

U.S. PATENT DOCUMENTS 5,692,279 A * 12/1997 Mang et al. ................ 29/25.35
5,789,845 A * 8/1998 Wadaka et al. .............. 310/334
6,344,705 B1 * 2/2002 Solal et al. .............. 310/313 B
6,486,751 B1 * 11/2002 Barber et al. .............. 333/187
6,600,389 B2 * 7/2003 Ma et al. .................... 333/186
6,670,866 B2 * 12/2003 Ella et al. .................. 333/133
6,710,677 B2 * 3/2004 Beaudin et al. ............. 333/133
2006/0103491 A1 * 5/2006 Tada et al. .................. 333/186

FOREIGN PATENT DOCUMENTS

JP 2000-077972 3/2000
JP 2001-345675 12/2001
JP 2003-532323 10/2003

OTHER PUBLICATIONS

Frank D. Bannon, III and Clark T.C. Nguyen; High-Q HF Microelectromechanical Filters; IEEE Journal of Solid-State Circuits; vol. 35, No. 4; Apr. 2000.

* cited by examiner

*Primary Examiner*—Barbara Summons
(74) *Attorney, Agent, or Firm*—Sonnenschein Nath & Rosenthal LLP

(57) ABSTRACT

A filter device configured with a plurality of micro-resonators and having a wide specific bandwidth. The filter device is configured as having a plurality of beam-structured, micro-resonators (15), (16), (17), (18) electrically connected in a lattice-forming manner between two input terminals (11), (12) for balanced input and two output terminals (13), (14) for balanced output, each of the plurality of micro-resonators (15), (16), (17), (18) being composed of a resonator group including a plurality of resonators differed in resonance frequency.

3 Claims, 5 Drawing Sheets

FILTER DEVICE AND TRANSMITTER-RECEIVER UTILIZING BEAM-STRUCTURED MICRO-RESONATORS

TECHNICAL FIELD

The present invention relates to a filter device configured by using micro-resonators, and a transmitter-receiver equipped with the same.

BACKGROUND ART

Along with progress in recent IT (information technology), the number of devices making use of networks shows a vast increase. In this situation, in particular in view of usability, there are increasing demands for wireless networking technology. An RF front-end module used for radio communication has, beside a semiconductor chip, relatively large-sized components, such as SAW (surface acoustic wave) filter and dielectric filter used for RF filter (high frequency filter) and IF filter (intermediate frequency filter), incorporated therein, so that presence of these components is causative of inhibiting miniaturization and cost reduction of the RF front-end module. Therefore, efforts has been made on realizing miniaturization and cost reduction of the RF front-end module, by incorporating these filter functions into a semiconductor chip. More specifically, there is known a technique of using a MEMS (micro-electro-mechanical system) element, a sort of micro-machine, as a resonator.

A resonator employing the MEMS element (referred to as micro-resonator, hereinafter) is formed on a semiconductor chip using semiconductor processes, and has a beam structure allowing the device to function as a resonator. The micro-resonator has advantages in that the device needs only a small space to occupy, can realize a high Q value (ratio of energy/loss), and can be integrated with other semiconductor devices. Therefore, a proposal has been made on using it as a radio communication device, especially as a frequency filter (RF filter, IF filter) (see, for example, High-Q HF Microelectromechanical Filters, "IEEE Journal of Solid-state Circuits", (U.S.A.), April 2000, Vol. 35, No. 4, p.512-526).

However, the micro-resonator disclosed in the above-described High-Q HF Microelectromechanical Filters has an extremely large Q value, and a specific bandwidth obtained in a case where the filter device is configured by mechanically connecting (coupling) beam electrodes of two micro-resonators with a rod-like elastic strip is only as small as 1% or below (0.23% according to the description in the document). In contrast to this, most of specific bandwidth required for the filter device is 2% or above, so that there has been a need of expanding the specific bandwidth in order to satisfy the demand.

The present invention was conceived in order to solve the above-described problems, and an object thereof resides in realizing expansion of the specific bandwidth of a filter device configured using micro-resonators.

DISCLOSURE OF THE INVENTION

A filter device according to the present invention has a plurality of beam-structured, micro-resonators electrically connected in a lattice-forming manner between two input terminals for balanced input and two output terminals for balanced output, each of the plurality of micro-resonators being composed of a resonator group including a plurality of resonators differed in resonance frequency. A transmitter-receiver of the present invention is equipped with the filter device configured as described above.

In the filter device and the transmitter-receiver equipped with the same according to the present invention, it is made possible to realize a filter function equivalent to that of a band-pass filter, by electrically connecting, in a lattice-forming manner, a plurality of beam-structured, micro-resonators between two input terminals and two output terminals. It is also made possible to ensure a wide specific bandwidth of the filter, by composing each of the plurality of micro-resonators of a resonator group including a plurality of resonators differed in the resonance frequency.

According to the present invention, it is possible to realize a filter device having a wide specific bandwidth by employing a plurality of micro-resonators.

BEST MODE FOR CARRYING OUT THE INVENTION

Specific embodiments of the present invention will be detailed below, referring to the attached drawings. In the embodiments of the present invention, a beam-structured resonator configured by employing a MEMS element, a sort of micro-machine, will be referred to as micro-resonator.

Figure 1A:
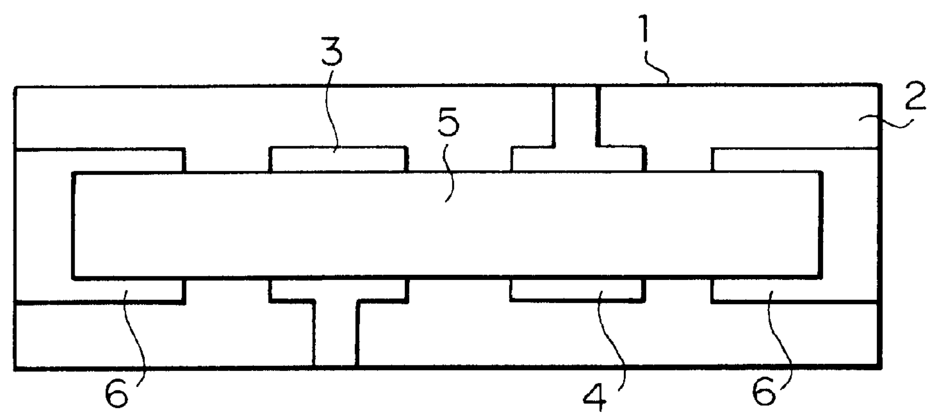
FIG. 1A and FIG. 1B are drawings showing an exemplary configuration of a micro-resonator used for the present invention.
Figure 1B:
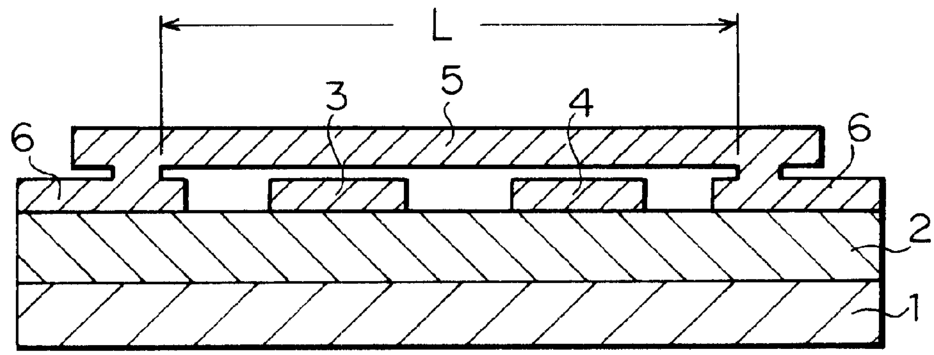

FIG. 1A and FIG. 1B show an exemplary configuration of a micro-resonator used for the present invention, in which FIG. 1A is a plan view of the micro-resonator, and FIG. 1B is a sectional side elevation of the micro-resonator. In FIG. 1A and FIG. 1B, an insulating film 2 is formed on a semiconductor substrate 1 which serves as a base. The semiconductor substrate 1 is composed of, for example, a silicon substrate, and the insulating film 2 is composed of, for example, a silicon nitride film.

On the insulating film 2, an input electrode 3 and an output electrode 4 are formed. Over the input electrode 3 and the output electrode 4, a beam electrode 5 is formed as being opposed with these two electrodes 3, 4. The both ends of the beam electrode 5 are supported by a pair of support portions 6 as being fixed thereto. The beam electrode 5 is formed in a bridge-like manner so as to step over the input electrode 3 and the output electrode 4, while keeping a micro-gap between itself and the individual electrode surfaces of the input electrode 3 and the output electrode 4. The input electrode 3 and the output electrode 4 are respectively disposed while keeping an equal distance away from the center of the longitudinal direction of the beam electrode 5 (lateral direction in FIG. 1A and FIG. 1B).

Figure 2A:
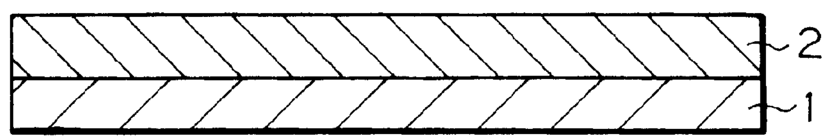
FIG. 2A to FIG. 2E are drawings (series 1) showing a flow of an exemplary process of fabricating the micro-resonator used for the present invention.
Figure 2B:
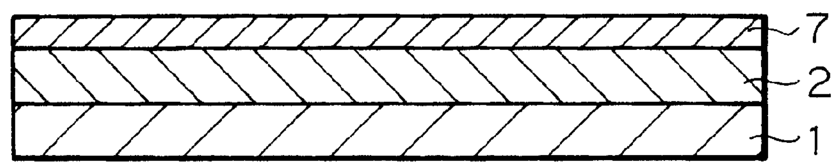
Figure 2C:
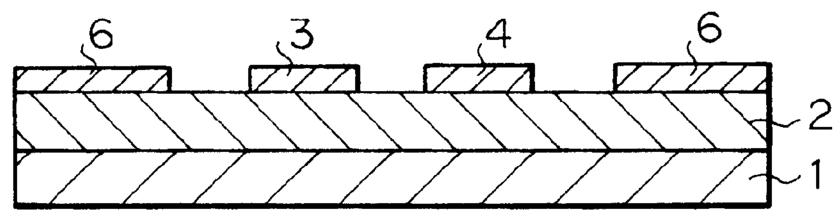

FIG. 2A to FIG. 2E and FIG. 3A to FIG. 3D are drawings showing a flow of exemplary process of fabricating the micro-resonator used for the present invention. First, in fabrication of the micro-resonator, as shown in FIG. 2A, the insulating film 2 is formed on the semiconductor substrate 1 such as silicon substrate. The insulating film 2 is formed by vapor deposition of, for example, a silicon nitride film to as thick as 1 μm. Next, as shown in FIG. 2B, on the insulating film 2 previously formed, a lower electrode layer 7 composed of a polysilicon layer of 0.5 μm thick, for example, is formed by vapor deposition, and the lower electrode layer 7 is then patterned by a photolithographic technique, to thereby form the above-described input electrode 3, the output electrode 4 and the pair of support portions 6, as shown in FIG. 2C.

Figure 2D:
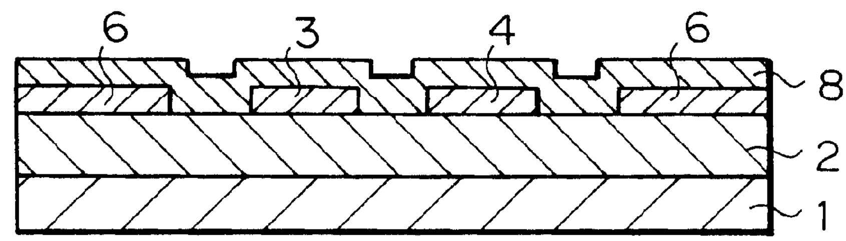
Figure 2E:
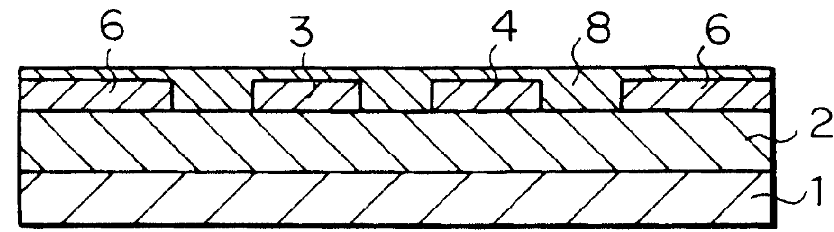

Next, as shown in FIG. 2D, on the insulating film 2 on the semiconductor substrate 1, a sacrificial layer 8 is formed so as to cover the above-mentioned input electrode 3, output electrode 4 and support portions 6. The sacrificial layer 8 is formed by vapor deposition of silicon oxide to as thick as 0.5 μm, for example. Next, as shown in FIG. 2E, the surface (top surface) of the sacrificial layer 8 is planarized by the CMP (chemical mechanical polishing) process.

Figure 3A:
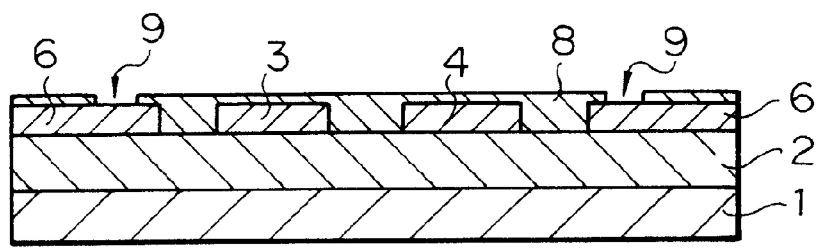
FIG. 3A to FIG. 3D are drawings (series 2) showing a flow of an exemplary process of fabricating the micro-resonator used for the present invention.
Figure 3B:
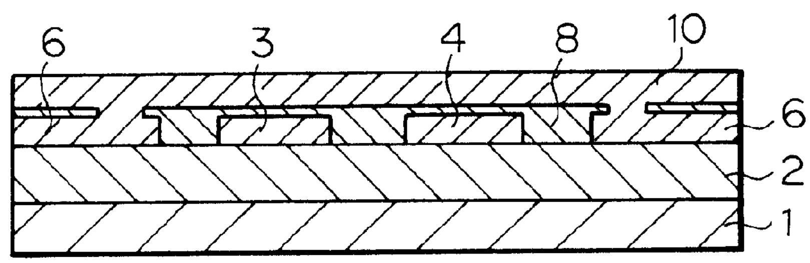
Figure 3C:
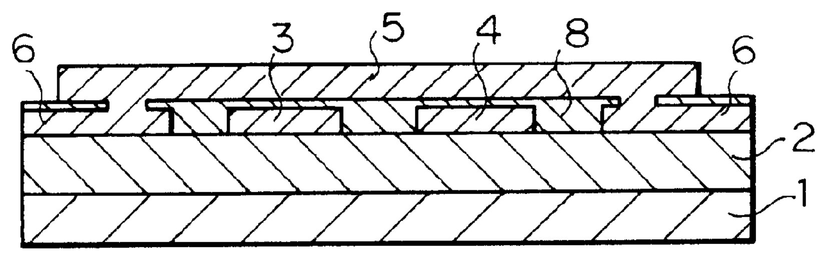
Figure 3D:
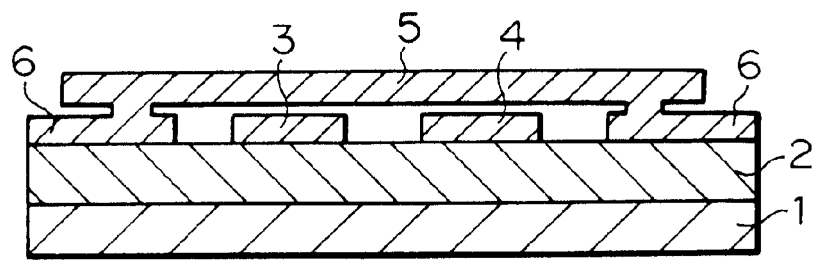

Subsequently, as shown in FIG. 3A, openings (contact holes) 9 are formed in the sacrificial layer 8 on the pair of support portions 6, and then as shown in FIG. 3B, an upper electrode layer 10 composed of, for example, a polysilicon layer of 0.5 μm thick is formed on the sacrificial layer 8 so as to fill the above-mentioned openings 9. Next, as shown in FIG. 3C, the upper electrode layer 10 is patterned using a photolithographic technique to thereby form the beam electrode 5. Thereafter, as shown in FIG. 3D, the sacrificial layer 8 is removed using a solution such as hydrofluoric acid, to thereby obtain the beam-structured, micro-resonator as shown in FIG. 1A and FIG. 1B.

In the micro-resonator obtained by the fabrication process described above, for example, input of a frequency signal (RF signal, IF signal, etc.) to the input electrode 3 while applying DC voltage (DC) causes repetitive generation of electrostatic attractive force and electrostatic repulsive force, which are generally referred to as coulomb force, in a region where the beam electrode 5 and the input electrode 3 oppose to each other. The beam electrode 5 causes micro-displacement in a direction approaching the input electrode 3 when the electrostatic attractive force occurs, and the beam electrode 5 causes micro-displacement in a direction away from the input electrode 3 when the electrostatic repulsive force occurs. By repeating this process, the beam electrode 5 resonates (vibrates) according to its own characteristic frequency, so that also the distance between the opposing beam electrode 5 and output electrode 4 consequently varies. Accordingly, a signal in a frequency band corresponded to the resonance frequency of the beam electrode 5 is output from the output electrode 4. It can be remarked now that the above-mentioned DC voltage may be applied to the beam electrode 5.

Figure 4:
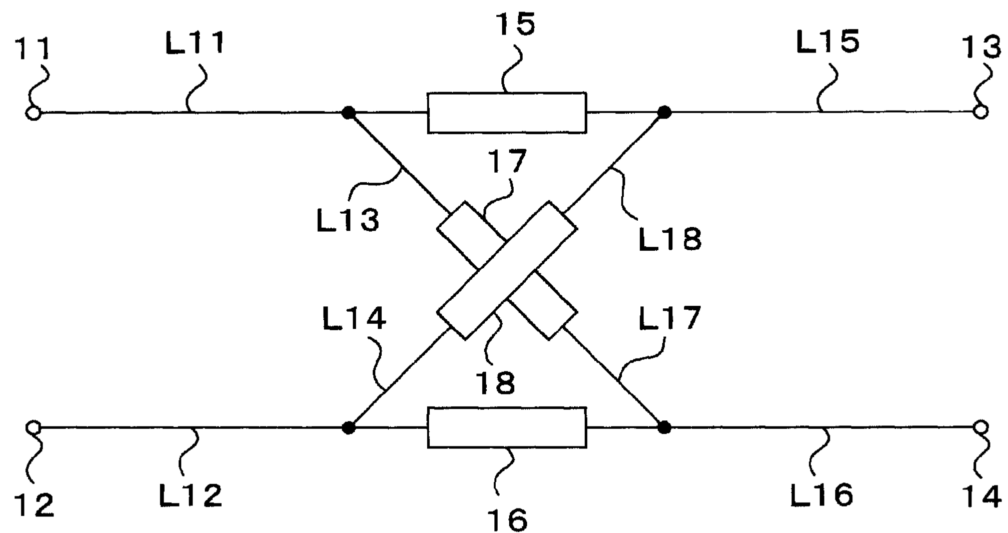
FIG. 4 is a schematic drawing showing a configuration of a filter device according to an embodiment of the present invention.

FIG. 4 is a schematic drawing showing a configuration of the filter device according to the embodiment of the present invention. In FIG. 4, a plurality of micro-resonators 15, 16, 17, 18 are electrically connected in a lattice-forming manner between two input terminals 11, 12 for balanced input and two output terminals 13, 14 for balanced output. Each of the micro-resonators 15, 16, 17, 18 is a micro-resonator having a beam structure obtained by the above-described fabrication process. To the input terminals 11, 12, frequency signals having phases opposite to each other are respectively input, and from the output terminals 13, 14 frequency signals having phases opposite to each other are respectively output.

Of the above-mentioned plurality of micro-resonators 15, 16, 17, 18, the micro-resonator 15 is connected in series between one input terminal 11 and the correspondent output terminal 13, and the micro-resonator 16 is connected in series between the other input terminal 12 and the correspondent other output terminal 14. In addition, the micro-resonator 17 is connected in series between the above-mentioned one input terminal 11 and the above-mentioned other output terminal 14, and the micro-resonator 18 is connected in series between the above-mentioned other input terminal 12 and the above-mentioned one output terminal 13.

In more detail, the input electrode of the micro-resonator 15 is electrically connected to the input terminal 11 through an interconnect line L11, and the input electrode of the micro-resonator 16 is electrically connected to the input terminal 12 through an interconnect line L12. The input electrode of the micro-resonator 17 is electrically connected to the input terminal 11 through interconnect lines L13, L11, and the input electrode of the micro-resonator 18 is electrically connected to the input terminal 12 through interconnect lines L14, L12.

On the other hand, the output electrode of the micro-resonator 15 is electrically connected to the output terminal 13 through an interconnect line L15, and the output electrode of the micro-resonator 16 is electrically connected to the output terminal 14 through an interconnect line L16. The output electrode of the micro-resonator 17 is electrically connected to the output terminal 14 through interconnect lines L17, L16, and the output electrode of the micro-resonator 18 is electrically connected to the output terminal 13 through interconnect lines L18, L15.

It can be remarked now that, for a case where a plurality of micro-resonators 15, 16, 17, 18 are formed on the same substrate together with the interconnect lines L11 to L18 respectively connected thereto, it is necessary to cross the interconnect lines L17, L18 or the interconnect lines L13, L14 on this substrate. In this case, for example, at the intersection of the interconnect lines L17, L18, the interconnect lines L17, L18 are crossed in a non-conduction manner by configuring the interconnect layer of the interconnect line L18 as having a double-layered structure, and by electrically connecting these layers through a contact hole.

Each of the above-mentioned plurality of micro-resonators 15, 16, 17, 18 is composed of a resonator group including a plurality of resonators differed in resonance frequency. The explanation below will be made on a specific exemplary configuration of the resonator group referring to the micro-resonator 15 based on FIG. 5. In the configuration of the illustrated micro-resonator 15, an input electrode 151 led to the input terminal 11 and an output electrode 152 led to the output terminal 13 are respectively formed so as to branch in two ways (151A, 151B, 152A, 152B). Of these, an input electrode 151A and an output electrode 152A are disposed side by side in parallel with each other so as to form a pair, and also an input electrode 151B and an output electrode 152B are disposed side by side in parallel with each other so as to form a pair.

The micro-resonator 15 has a plurality (14 pieces in this example) of beam electrodes 153A to 153N. Of these, the half (7 pieces) of the beam electrodes 153A to 153G are individually formed in a bridge-like manner so as to step across the input electrode 151A and the output electrode 152A, and the residual half of the beam electrodes 153H to 153N are individually formed in a bridge-like manner so as to step across the input electrode 151B and the output electrode 152B. Basic positional relation among the input electrodes, the output electrodes and the beam electrodes is the same as that in the case shown in FIG. 1A and FIG. 1B. As a consequence, a single resonator is constituted of a combination of the input electrode 151A, the output electrode 152A and the beam electrode 153A. Combination of the input electrode 151A, the output electrode 152A and the seven beam electrodes 153A to 153G constitutes seven resonators, and combination of the input electrode 151B, the output electrode 152B and the seven beam electrodes 153H to 153N again configures seven resonators. Therefore, the micro-resonator 15 is constituted of a resonator group having 14 resonators in total. Fourteen resonators owned by the micro-resonator 15 are electrically connected in parallel respectively using common input electrode 151 (151A, 151B) and the output electrode 152 (152A, 152B).

Of the above-described 14 resonators, denoting now the resonance frequencies of two resonators configured by using the beam electrodes 153A, 153B as respectively "f1", the resonance frequencies of three resonators configured by using the beam electrodes 153C, 153D, 153E as respectively "f2", the resonance frequencies of four resonators configured by using the beam electrodes 153F, 153G, 153H, 153I as respectively "f3", the resonance frequencies of three resonators configured by using the beam electrodes 153J, 153K, 153L as respectively "f4", and the resonance frequencies of two resonators configured by using the beam electrodes 153M, 153N as respectively "f5", these resonance frequencies are set to values differed from each other.

For example, assuming now that the resonance frequency of the micro-resonator 15 is represented by f3, the resonance frequencies of the individual resonators is set so as to satisfy the condition of f1<f2<f3<f4<f5 while placing f3 at the center. As examples of specific values, the resonance frequency of two resonators using the beam electrodes 153A, 153B is set to f1=99.6 MHz, the resonance frequency of three resonators using the beam electrodes 153C, 153D, 153E is set to f2=99.8 MHz, the resonance frequency of four resonators using the beam electrodes 153F, 153G, 153H, 153I is set to f3=100 MHz, the resonance frequency of three resonators using the beam electrodes 153J, 153K, 153L is set to f4=100.2 MHz, and the resonance frequency of two resonators using the beam electrodes 153M, 153N is set to f5=100.4 MHz.

The resonance frequencies of the individual resonators are adjustable (variable) using the length or mass of the beam electrodes as parameters. In other words, a larger length L of the beam electrode (see FIG. 1A and FIG. 1B) correspondingly lowers the resonance frequency of the resonator, and a smaller length L of the beam electrode correspondingly raises the resonance frequency. On the other hand, a smaller mass of the beam electrode correspondingly lowers the resonance frequency of the resonator, and a larger mass of the beam electrode correspondingly raises the resonance frequency.

Accordingly, for a case where the resonance frequencies of the individual resonators in the micro-resonator 15 are set so as to satisfy the above-described condition, while using the length of the beam electrodes (beam length) as a parameter, a relation among the length "L1" of the beam electrodes 153A, 153B, the length "L2" of the beam electrodes 153C, 153D, 153E, the length "L3" of the beam electrodes 153F, 153G, 153H, 153I, the length "L4" of the beam electrodes 153J, 153K, 153L, and the length "L5" of the beam electrodes 153M, 153N is set as L1>L2>L3>L4>L5.

On the other hand, for a case where the resonance frequencies of the individual resonators in the micro-resonator 15 are set so as to satisfy the above-described condition, while using the mass of the beam electrodes as a parameter, a relation among the mass "M1" of the beam electrodes 153A, 153B, the mass "M2" of the beam electrodes 153C, 153D, 153E, the mass "M3" of the beam electrodes 153F, 153G, 153H, 153I, the mass "M4" of the beam electrodes 153J, 153K, 153M, and the mass "M5" of the beam electrodes 153M, 153N is set as M1<M2<M3<M4<M5.

It can be remarked now that the length of the beam electrodes is arbitrarily adjustable in the phase of design of the resonator. In addition, the mass of the beam electrodes is adjustable in the phase of design of the micro-resonator, or by thickness control in the electrode film-forming process, or by cutting off part of the beam electrodes by laser trimming.

Figure 5:
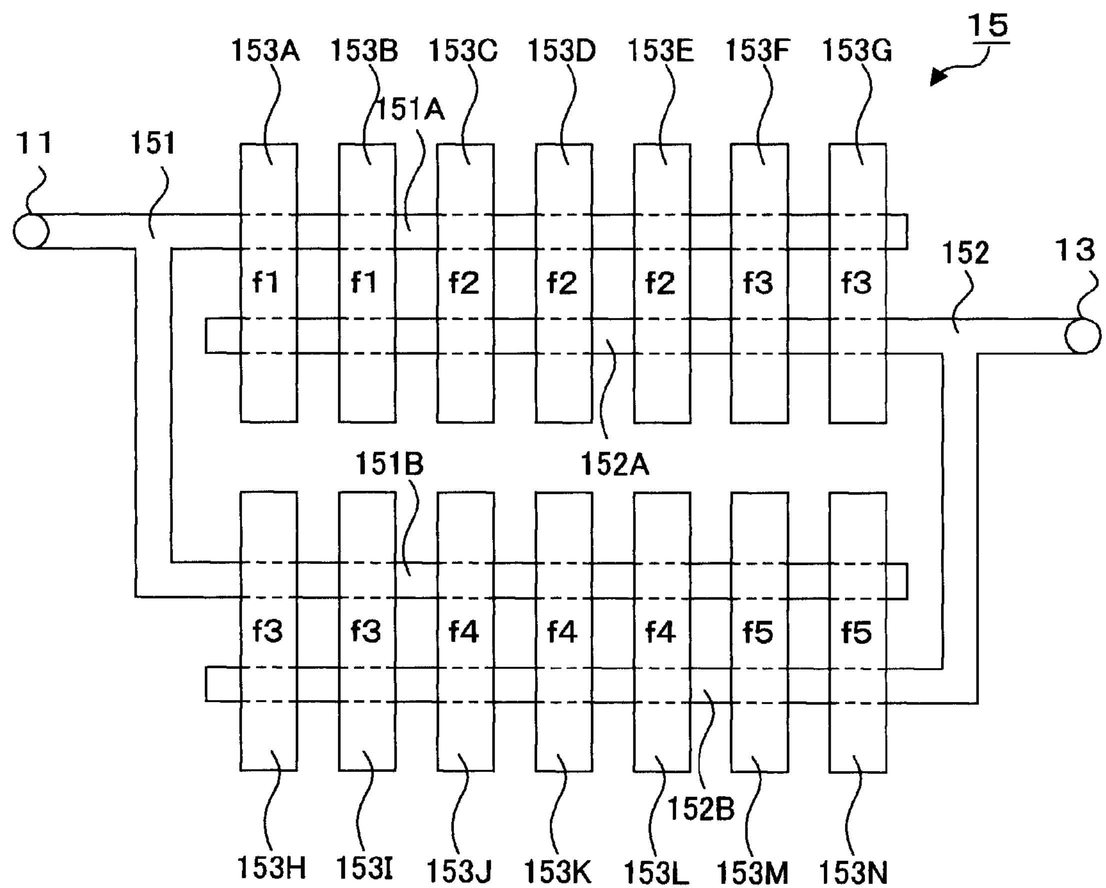
FIG. 5 is a schematic plan view showing an internal structure of the micro-resonator adopted in the embodiment of the present invention.

In FIG. 5 above, the resonators having the same resonance frequency are arranged adjacent to each other, whereas the order of arrangement of the resonators can arbitrarily be altered. However, in view of resonance frequency distribution in the resonator group, it is preferable to make the resonance frequencies distribute almost uniformly (at regular intervals) stepped from a reference frequency which is set at a resonance frequency falls on the center of the frequency distribution (f3 in the above-described example), and to set the number of resonators largest for those resonating at the reference frequency, while step-wisely reducing the number of resonators as a shift of the resonance frequency from the reference frequency becomes larger.

Figure 6A:
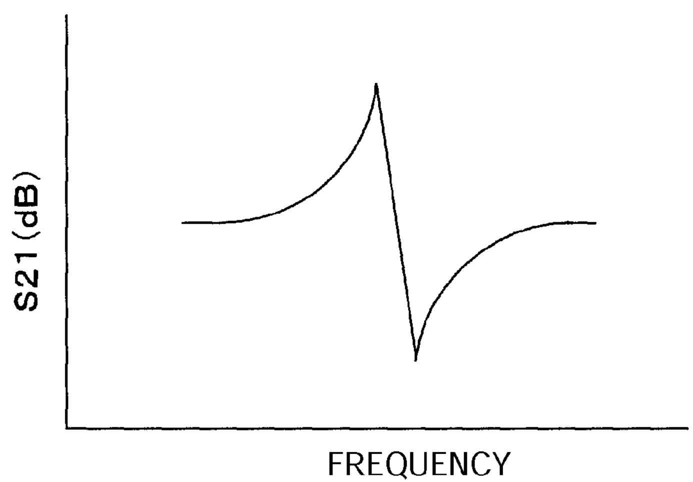
FIG. 6A to FIG. 6C are drawings showing resonance characteristics of the micro-resonator and signal transmittance characteristic of a filter device.
Figure 6B:
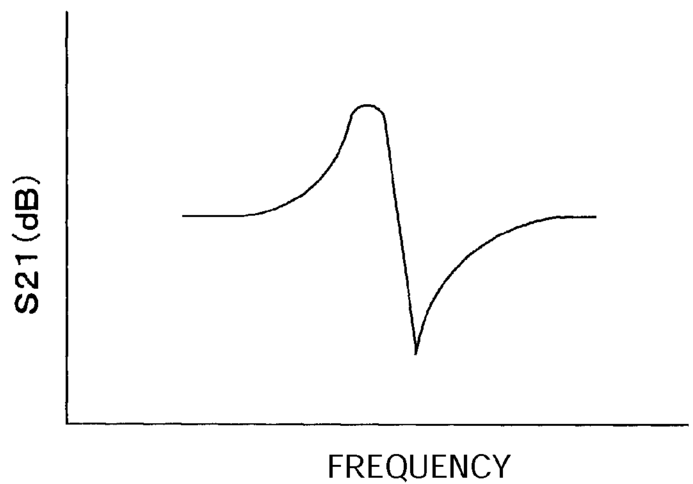

Assuming now a hypothetical case where the resonance frequencies (f1 to f5) of all of the resonators in the resonator group constituting the micro-resonator 15 are set to a same value (100 MHz, for example), the resonance characteristics of the micro-resonator 15 will be given as in FIG. 6A. In contrast to this, for a case where the resonance frequencies (f1 to f5) of the individual resonators in the resonator group composing the micro-resonator 15 are set according to the above-described condition (f1=99.6 MHz, f2=99.8 MHz, f3=100 MHz, f4=100.2 MHz, f5=100.4 MHz), as shown in FIG. 6B, a plurality of resonance points appears at the same time in the frequency band of f1-f5 in accordance with the resonance frequency distribution of the individual resonators. For this reason, the resonance points are given as being generally rounded in the frequency band between the minimum value f1 and the maximum value f5 of the resonance frequency. By setting herein the resonance frequency distribution and the number of resonators according to the above-described relation, it is made possible to round the resonance points which appear in the frequency range from f1 to f5, while minimizing distortion thereof.

The configuration of the micro-resonator 15 is applicable in the same way also to the other micro-resonators 16, 17, 18. The micro-resonator 15 connected in series between the input terminal 11 and the output terminal 13, and the micro-resonator 16 connected in series between the input terminal 12 and the output terminal 14 are set to have a same resonance frequency. Also the micro-resonator 17 connected in series between the input terminal 11 and the output terminal 14, and the micro-resonator 18 connected in series between the input terminal 12 and the output terminal 13 are set to have a same resonance frequency. It is, however, to be noted that the resonance frequency of the micro-resonators 15, 16 and the resonance frequency of the micro-resonators 17, 18 are set at frequencies differed from each other. For example, assuming now that the resonance frequency of the micro-resonators 15, 16 is denoted as "F1", and that the resonance frequency of the micro-resonators 17, 18 is denoted as "F2", they are set so as to satisfy a relation of F1>F2 (F1=100 MHz, F2=98 MHz, for example).

Accordingly, the resonance frequencies (f1 to f5) of the individual resonators in the resonator group constituting the micro-resonator 16 are set similarly to those in the micro-resonator 15, but the resonance frequencies (f1 to f5) of the individual resonators in the resonator group constituting the micro-resonator 17 and the resonance frequencies (f1 to f5) of the individual resonators in the resonator group constituting the micro-resonator 18 are set, for example, as f1=97.6 MHz, f2=97.8 MHz, f3=98 MHz, f4=98.2 MHz and f5=98.4 MHz, while satisfying the above-described relation of $f1<f2<f3<f4<f5$.

In a case where thus-configured filter device is allowed to operate, while applying DC voltage (DC) to the above-described two input terminals 11, 12 (or the individual beam electrodes of the above-described plurality of micro-resonators 15, 16, 17, 18), frequency signals (RF signal, IF signal, etc.) having phases opposite to each other are respectively input to the input terminals 11, 12. The frequency signal input through the input terminal 11 is then given to the individual input electrodes of the micro-resonators 15, 17, and the frequency signal input through the input terminal 12 is given to the individual input electrodes of the micro-resonators 16, 18. Therefore, in the individual micro-resonators 15, 16, 17, 18, the beam electrodes corresponded to each of them resonate in accordance with their own characteristic frequencies, and the frequency signals corresponded to the resonance frequencies are extracted through their correspondent output electrodes. The frequency signals extracted through the individual output electrodes of the micro-resonators 15, 18 are output from the output terminal 13, and the frequency signals extracted through the individual output electrodes of the micro-resonators 16, 17 are output from the output terminal 14.

Figure 6C:
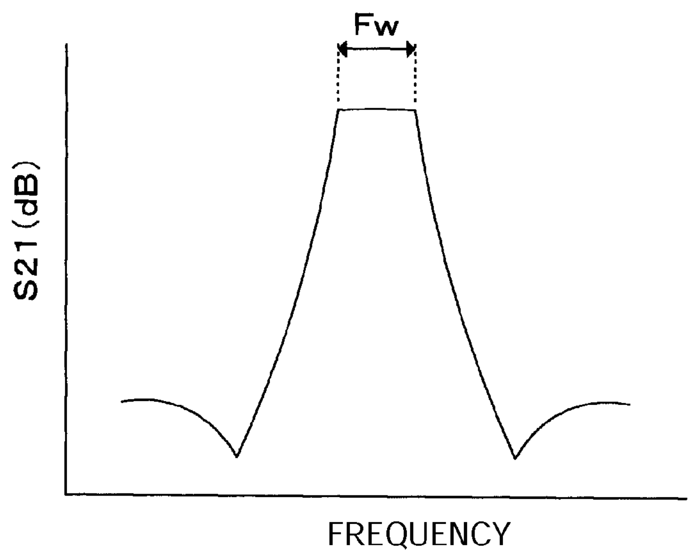

In this way, the frequency bands of the frequency signals output from two output terminals 13, 14 are made correspondent to resonance frequency F1 of these two micro-resonators 15, 16 and resonance frequency F2 of these two micro-resonators 17, 18. The resonance characteristic of the individual micro-resonators 15, 16, 17, 18 is given as shown in FIG. 6B, and a filter characteristic of these micro-resonators 15, 16, 17, 18 combined (electrically connected) in a lattice-forming manner is given, as shown in FIG. 6C, as having a broad and flat signal transmittance band Fw corresponding to the resonance frequencies (center frequencies) F1, F2 of the individual micro-resonators 15, 16, 17, 18. Therefore, the signal transmittance characteristic of the filter device can be such that a broader specific frequency band is ensured. As a consequence, a filter device having a specific frequency band of 2% or more can be realized by combining a plurality of micro-resonators.

Also a filter device having a filter function equivalent to that of band-pass filter can be realized, only by electrically connecting the micro-resonators, without mechanically connecting the beam electrodes of the micro-resonators. It is therefore made possible to achieve miniaturization, cost reduction and higher reliability of the filter device.

The present invention is not limited to the filter device using the micro-resonators, but can be provided as a transmitter-receiver, configured by using the filter device, for communication using electromagnetic wave, such as mobile phone, wireless LAN device, television tuner, radio tuner and so forth.

The invention claimed is:

1. A filter device comprising:

a plurality of beam-structured, micro-resonators electrically connected in a lattice-forming manner between two input terminals for balanced input and two output terminals for balanced output, wherein, each of said plurality of micro-resonators is composed of a resonator group including a plurality of resonators differed in resonance frequency, and said resonator group has a plurality of beam electrodes differed in beam length.

2. The filter device as claimed in claim 1, characterized in that said resonator group has a plurality of beam electrodes differed in beam mass.

3. A transmitter-receiver comprising:

a filter device having:

a plurality of beam-structured, micro-resonators electrically connected in a lattice-forming manner between two input terminals for balanced input and two output terminals for balanced output, wherein, each of said plurality of micro-resonators being composed of a resonator group including a plurality of resonators differed in resonance frequency, and said resonator group has a plurality of beam electrodes differed in beam length.

* * * * *